United States Patent

Fujikawa et al.

Patent Number: 5,520,744
Date of Patent: May 28, 1996

[54] DEVICE FOR RINSING AND DRYING SUBSTRATE

[75] Inventors: Kazonori Fujikawa; Masato Tanaka, both of Shiga; Yusuke Muraoka, Kyoto, all of Japan

[73] Assignee: Dainippon Screen Manufacturing Co., Ltd., Japan

[21] Appl. No.: 245,241

[22] Filed: May 17, 1994

[30] Foreign Application Priority Data

May 17, 1993 [JP] Japan .................................... 5-140086

[51] Int. Cl.⁶ .................................................. B08B 15/00
[52] U.S. Cl. ...................... 134/11; 134/25.4; 134/95.2; 134/102.1; 134/102.3; 134/902
[58] Field of Search ..................................... 134/902, 105, 134/201, 200, 76, 11, 45.1, 102.3, 102.1, 25.1

[56] References Cited

U.S. PATENT DOCUMENTS

| | | | |
|---|---|---|---|
| 4,714,086 | 12/1987 | Kishida et al. | |
| 4,736,758 | 4/1988 | Kusuhara | 134/902 |
| 5,158,100 | 10/1992 | Tanaka et al. | 134/902 |
| 5,273,589 | 12/1993 | Griswold et al. | 134/902 |
| 5,301,701 | 4/1994 | Nafziga | 134/111 |
| 5,331,987 | 7/1994 | Hayashi et al. | 134/902 |
| 5,361,789 | 11/1994 | Yoshida et al. | 134/902 |

FOREIGN PATENT DOCUMENTS

| | | |
|---|---|---|
| 0385536 | 9/1990 | European Pat. Off. . |
| 60-223130 | 11/1985 | Japan . |
| 62-198126 | 9/1987 | Japan . |
| 63-10528 | 1/1988 | Japan . |
| 227723 | 1/1990 | Japan . |
| 3-30330 | 2/1991 | Japan . |
| 3-62521 | 3/1991 | Japan ................................. 134/902 |
| 3-220722 | 9/1991 | Japan . |
| 4-155923 | 5/1992 | Japan . |
| 4-155922 | 5/1992 | Japan . |
| 4-251929 | 9/1992 | Japan . |
| 4-366132 | 12/1992 | Japan . |

Primary Examiner—Frankie L. Stinson
Attorney, Agent, or Firm—Ostrolenk, Faber, Gerb & Soffen

[57] ABSTRACT

Deionized water is supplied into a rinsing bath from its bottom portion and overflows from the upper portion of the rinsing bath to form an upflow of deionized water in the rinsing bath. A substrate is rinsed by being immersed in the upflow of deionized water. After rinsing, the substrate is removed from deionized water, and at this tim the surroundings of the substrate are supplied with vapor of an organic solvent soluble in water which serves to lower surface tension of deionized water to the substrate. Thereafter, the substrate is dried in a sealed chamber that is evacuated and the surroundings of the substrate are reduced in pressure. As a result, during drying the substrate surface after rinsing same with deionized water, it is possible to reduce adhesion of particles to the substrate surface, and to dry the substrate surface rapidly without heating the substrate.

11 Claims, 9 Drawing Sheets

DEVICE FOR RINSING AND DRYING SUBSTRATE

BACKGROUND OF THE INVENTION

1. Field of the Invention

The present invention relates to a device and a method for rinsing various substrates such as silicon wafers, glass substrates, and electronic components with deionized water and drying the surface thereof in a manufacturing process that is used to produce semiconductor devices, liquid crystal display, other electronic components, or the like. More particularly, the present invention relates to a device and a method which can be relied upon for rinsing and drying a substrate.

2. Description of the Related Art

A device for rinsing and drying a substrate of interest to the present invention is disclosed in, for example, European Patent Publication No. 0 385 536A1. According to this publication, a substrate is immersed for some time in a bath containing a rinsing solution, and then taken therefrom so slowly that the solution remains in the bath. When the substrate is taken from the bath, the substrate is simultaneously brought into contact with vapor of a substance not condensing on the substrate which produces a mixture having surface tension lower than that of the rinsing solution when mixed with the rinsing solution. As a result, the substrate is preferably rinsed and dried.

In a method disclosed in the aforesaid publication, particles removed from the substrate surface by rinsing and diffused into the rinsing solution concentrate in the vicinity of the solution surface. When the substrate is taken from the solution in this state, particles sometimes readhere to the substrate surface.

SUMMARY OF THE INVENTION

One object of the present invention is, therefore, to rinse and dry a substrate reliably in a device for rinsing and drying a substrate.

Another object of the present invention is to carry out drying efficiently in a device for rinsing and drying a substrate.

Still another object of the present invention is to prevent readhesion of particles to the surface of a substrate in a device for rinsing and drying a substrate.

A further object of the present invention is to provide a method by which a substrate can be rinsed and dried.

To achieve the above-described objects, the present invention in one aspect thereof, provides a device for rinsing and drying a substrate, which device includes a hermetically sealable process chamber, a rinsing bath having an upper opening, and being disposed in the process chamber a substrate holder for holding the substrate in the rinsing bath, a supply unit for supplying a rinsing solution to the rinsing bath so that it overflows from the upper opening, a unit for exposing the substrate from the rinsing solution after rinsing, a unit for reducing the internal pressure of the process chamber, and a unit for supplying vapor of an organic solvent to surroundings of the substrate thereby lowering surface tension of the rinsing solution while exposing the substrate.

When the substrate is rinsed, the rinsing solution overflows from the upper opening of the rinsing bath. Particles removed from the substrate surface by rinsing and diffused into the solution overflow. When the substrate is being exposed surroundings of the substrate are reduced in pressure, and vapor of an organic solvent is supplied thereby lowering the surface tension of the rinsing solution to the substrate in the sealed chamber, Therefore, it is possible to provide a device for rinsing and drying a substrate which can rinse and dry a substrate reliably.

Further, according to the present invention, since the substrate is dried in the sealed chamber, the substrate can be processed under stable condition wherein no foreign particles exist and danger accompanied by handling the organic solvent can be minimized.

In another aspect of the present invention, a method of rinsing and drying a substrate includes the steps of continuously supplying a rinsing solution in a rinsing bath so that it overflows from an upper portion of the rinsing bath to form an upflow of the rinsing solution in the rinsing bath, rinsing the substrate by placing the substrate in the upflow, removing the substrate from the rinsing solution while supplying to surroundings of the substrate vapor of an organic solvent which serves to lower surface tension of the rinsing solution, and drying the substrate with the surroundings of the substrate reduced in pressure.

The rinsing solution overflowing from the upper portion of the rinsing bath forms an upflow of the rinsing solution in the rinsing bath. Since the substrate is placed in the upflow and rinsed, particles removed from the substrate surface by rinsing are diffused into the solution that overflows from the rinsing bath with the upflow. By supplying vapor of an organic solvent to the substrate thereby lowering the surface tension of the rinsing solution. The substrate is exposed and dried under reduce pressure. As a result, it is possible to provide a method of rinsing and drying a substrate efficiently without readhesion of particles.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the present invention will now be described with reference to the drawings.

(1) First Embodiment

Figure 1:
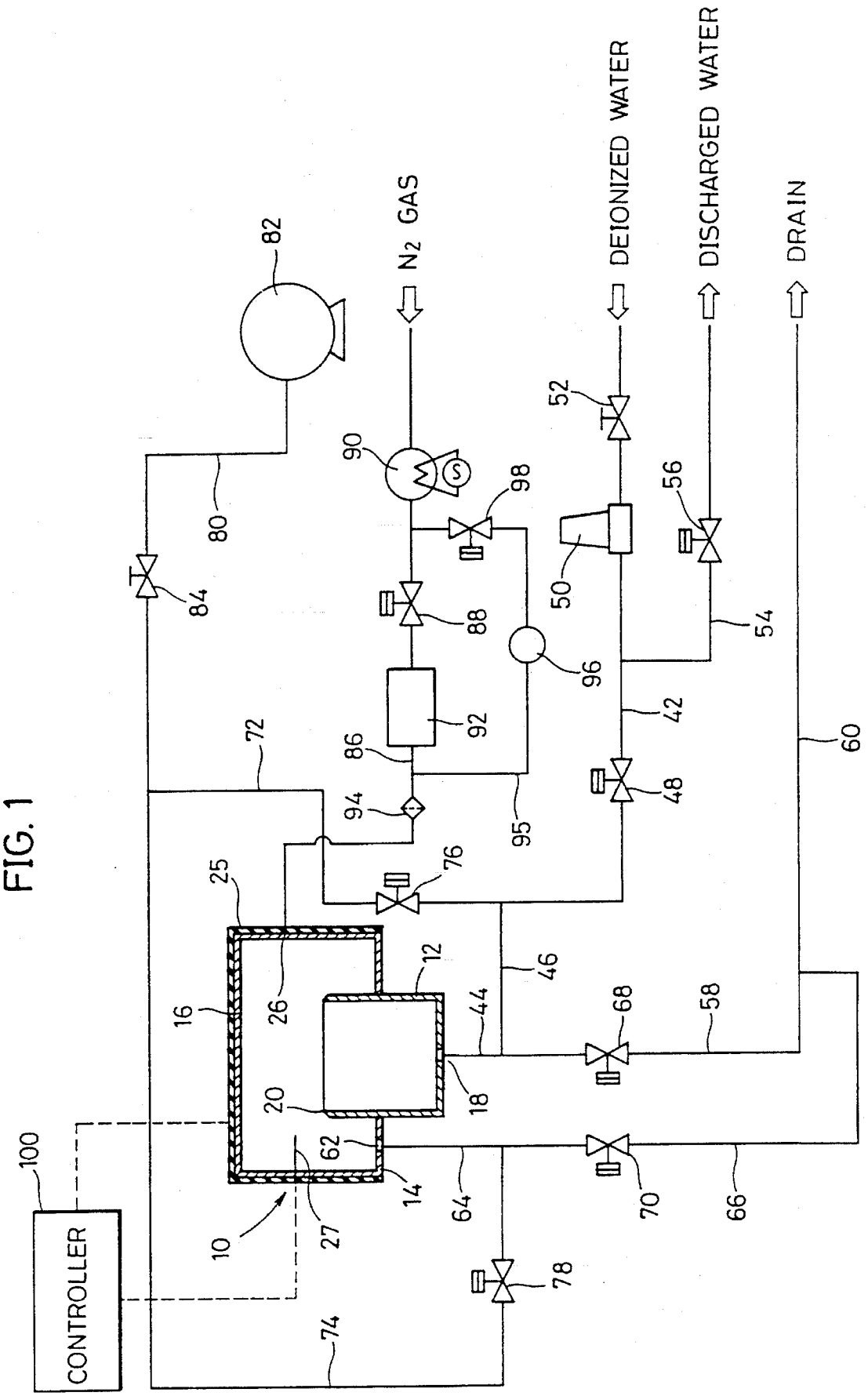
FIG. 1 is a schematic diagram showing one example of the entire configuration of a device implementing a method of rinsing and drying a substrate according to the present invention.
Figure 2:
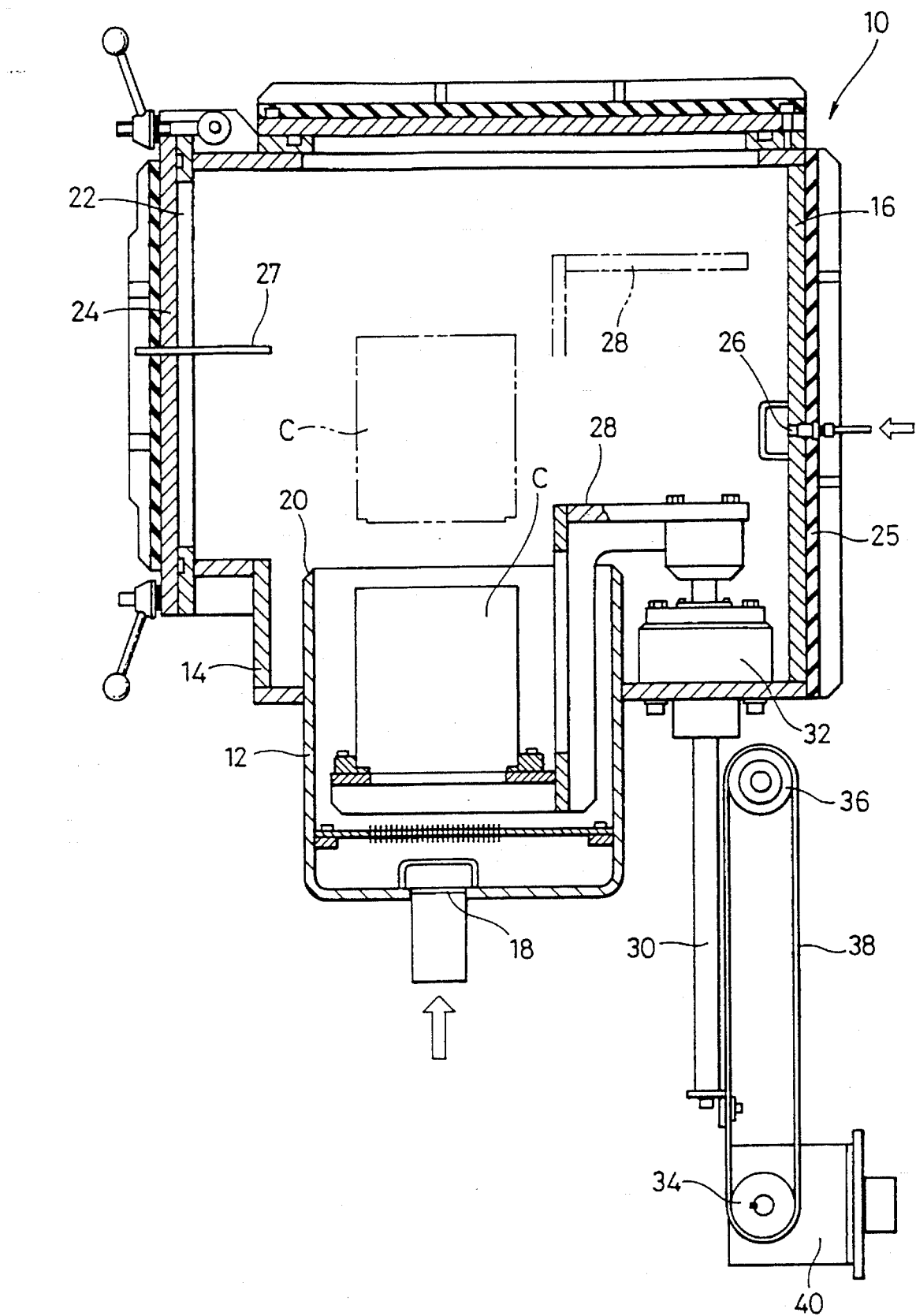
FIG. 2 is a sectionalized side view showing the configuration of a rinsing/drying processing unit of the device shown in FIG. 1.

Rinsing/drying processing unit 10 FIGS. 1 and 2 includes a rinsing bath 12, an overflow receptacle unit 14, and a hermetically sealable chamber 16. Rinsing bath 12 has a supply inlet 18 for deionized water provided at its bottom portion and an overflow portion 20 provided at its upper portion. Rinsing bath 12 and overflow receptacle unit 14 form a double-bath structure so that deionized water overflowing rinsing bath 12 enters overflow receptacle unit 14. Rinsing bath 12 has an inner volume in which a cassette C carrying a plurality of substrates, for example, silicon wafers, can be completely immersed in the deionized water contained therein. Chamber 16 covers rinsing bath 12 and overflow receptacle unit 14. Chamber 16 has an opening 22 on the front side for getting the cassette C carrying a plurality of wafers in and out. Opening 22 can be closed hermetically by a sealing lid 24. Chamber 16 has a supply inlet 26 for vapor on its sidewall surface. A rubber heater 25 is provided on the outer wall surface of chamber 16 so as to cover the same. A thermometer 27 for detecting the temperature of an inner wall surface of chamber 16 penetrates through a wall surface of sealing lid 24.

A holding member 28 for holding the cassette C carrying wafers is provided in chamber 16. An elevating and lowering driving mechanism is provided in chamber 16 for reciprocating holding member 28 up and down to elevate and lower the cassette C held by holding member 28 between the position above the rinsing bath shown by a two-dotted line and the position in the rinsing bath shown by a solid line. The elevating and lowering driving mechanism includes a driving rod 30 having its upper end portion connected to holding member 28, a bearing device 32 supporting driving rod 30 slidably, a driving pulley 34 and a driven pulley 36, a belt 38 wrapped between pulleys 34 and 36 and to which the lower end portion of driving rod 30 is fixed, and a driving motor 40 rotating and driving pulley 34. The cassette C may be omitted when holding member 28 directly holds a plurality of wafers.

A flow line 42 for supplying deionized water connected to a supply source for deionized water is connected to supply inlet 18 for deionized water of rinsing bath 12 through flow lines 44, 46. Flow line 42 is provided with an air open/close valve 48, a filter 50, and a ball valve 52. A flow line 54 for returning deionized water is branched from flow line 42. Flow line 54 is provided with an air open/close valve 56. Supply inlet 18 of rinsing bath 12 is connected not only to flow line 42, but also to a flow line 58 for discharging deionized water branched from flow line 44. Flow line 58 is connected to a drain through flow line 60. At overflow receptacle unit 14, provided is a water outlet 62, to which a flow line 66 for discharging water is connected through a flow line 64. Flow line 66 joins flow line 58 to be connected to the drain through flow line 60. Flow line 58 and flow line 66 are provided with air open/close valves 68 and 70, respectively.

Supply inlet 18 of rinsing bath 12 is further connected to a vacuum flow line 72 branched from flow line 46. On the other hand, water outlet 62 of overflow receptacle unit 14 is connected to a vacuum flow line 74 branched from flow line 64. Vacuum flow lines 72, 74 are provided with air open/close valves 76, 78, respectively. Vacuum flow lines 72, 74 join to be connected to a water ring vacuum pump 82 through a vacuum flow line 80. In the figure, a reference character 84 denotes a ball valve provided at vacuum flow line 80.

A flow line 86 for supplying vapor connected to a supply source for inactive gas, for example, nitrogen ($N_2$) gas, is connected to a supply inlet 26 for vapor of chamber 16. Flow line 86 is provided with an air open/close valve 88, a heater 90, an alcohol vapor generating unit 92, and a filter 94. In alcohol vapor generating unit 92, vapor of the alcohol family is generated, such as methyl alcohol, ethyl alcohol, and IPA (Isopropyl Alcohol). As an organic solvent which is water soluble and serving to lower surface tension of deionized water to the substrate, similar to the alcohol family, the ketone family such as acetone and diethyl ketone, the ethyl family such as methyl ether and ethyl ether, polyhydric alcohol such as ethylene glycol, or the like, can also be used. Since many solvents containing a small amount of impurities such as a metal are commercially available, it is the most preferable to use IPA. Alcohol vapor can be generated in alcohol vapor generating unit 92 with a method of blowing inactive gas into alcohol, a method of bubbling, a method of using ultrasonic, or the like. Alcohol vapor generating unit 92 has a temperature adjusting function, so that alcohol vapor adjusted to a predetermined temperature is generated. A branch flow line 95 parallels a portion of flow line 86 with one end of line 95 between air open/close valve 88 and heater 90 and joins being connected to line 86 at a point between alcohol vapor generating unit 92 and filter 94. Branch flow line 95 is provided with an ionizer 96 and an air open/close valve 98. With air open/close valve 88 opened, nitrogen gas sent from the nitrogen gas supply source is heated by heater 90. With the heated nitrogen gas, the alcohol vapor generated in alcohol vapor generating unit 92 is sent through flow line 86. The alcohol vapor is cleaned by filter 94 together with the nitrogen gas, and then supplied to chamber 16 through supply inlet 26. By opening air open/close valve 98, the nitrogen gas sent from the nitrogen gas supply source and heated by heater 90 is ionized by ionizer 96. The heated ionized nitrogen gas cleaned by filter 94 can also be supplied to chamber 16 through supply inlet 26.

The device is provided with a controller 100 for keeping the temperature of an inner wall surface of chamber 16 at a predetermined temperature, for example, a temperature higher than that of heated deionized water, for a predetermined period of time by controlling rubber heater 25 based on a detect signal of thermometer 27.

Description will now be given of a method of rinsing and drying a substrate, for example, a silicon wafer, by using a device of the above-described configuration.

Air open/close valves 48 and 70 are opened and the other air open/close valves 56, 68, 76, 78, 88 and 98 are closed. Deionized water, for example, heated deionized water, is supplied from the supply source for deionized water through flow lines 42, 46, 44. By continuously supplying heated deionized water to rinsing bath 12 from supply inlet 18 provided at the bottom portion, an upflow of heated deionized water is formed in rinsing bath 12. The heated deionized water filling rinsing bath 12 overflows from the upper overflow portion 20 to enter overflow receptacle unit 14. The heated deionized water flows from overflow receptacle unit 14 to water outlet 62 and flow lines 64, 66, 60 to be discharged to the drain. Simultaneously, the wall surface of chamber 16 is heated by rubber heater 25. While the wall surface is heated, rubber heater 25 is controlled by controller 100 based on a detect signal of thermometer 27 provided at the wall surface of sealing lid 24 so that the temperature of the inner wall surface of chamber 16 is kept at a predetermined temperature, for example, a temperature higher than that of the heated deionized water (60° C. as an example). By heating the inner wall surface of chamber 16 as described above, water vapor does not condense on the inner wall surface or the like of chamber 16 in the steps of rinsing a wafer and withdrawing the wafer from the deionized water, to be described later. As a result, when the alcohol vapor is supplied to the surroundings of the wafer, the vapor is not deprived of thermal energy by condensed drops of water, thereby improving the efficiency of drying of a wafer. The plurality of wafers carried by the cassette C are conveyed in chamber 16 through opening 22, and sealing lid 24 is hermetically closed.

The elevating and lowering driving mechanism is operated to lower the cassette C held by holding member 28 to the position shown by the solid line of FIG. 2. The wafers are immersed in the heated deionized water in rinsing bath 12, placed in the upflow of the heated deionized water for a predetermined time, and rinsed. As a result, particles are removed from the surface of the wafers. and diffused into the heated deionized water being discharged from rinsing bath 12 together with the heated deionized water overflowing from overflow portion 20 at the upper portion of rinsing bath 12.

After completion of rinsing of the wafers, the elevating and lowering driving mechanism is operated to elevate the cassette C held by holding member 28 to the position shown by the two-dotted line of FIG. 2. This causes the wafers to be pulled upward out of the heated deionized water in rinsing bath 12. Since the wafers are pulled upward while being removed from the heated deionized water as described above, the particles diffused into the heated deionized water do not readhere to the wafer surface. As soon as the wafers begin to be removed from the heated deionized water, air open/close valve 88 is opened to send nitrogen gas from the supply source for nitrogen through alcohol vapor generator 92 and flow line 86. The alcohol vapor from generator 92 is introduced into chamber 16 from supply inlet 26, so that the alcohol vapor is supplied to the surroundings of the wafers which are being pulled upward to remove them from the heated deionized water. The alcohol vapor is continuously supplied until the wafers are completely removed from the heated deionized water. By opening air open/close valve 88 before the wafers begin to be removed from the heated deionized water and introducing the alcohol vapor into chamber 16, the upper of the deionized water may already be covered with the alcohol vapor when the wafers begin to piece the upper surface of the heated deionized water. Heating of the wall surface of chamber 16 by rubber heater 25 is completed when supplying of the alcohol vapor to the surroundings of the wafers commences starts. However, the wall surface of chamber 16 may be continuously heated until drying of the wafers is completed.

Preferably 94 is heated before air open/close valve 88 is opened and the alcohol vapor is supplied into chamber 16, by opening air open/close valve 98 and introducing heated nitrogen gas (no ionization of which is required, into chamber 16 through branch flow line 95 from the supply source for nitrogen. Air open/close valve 98 may be opened to introduce heated ionized nitrogen gas into chamber 16, in parallel to opening of air open/close valve 88 to supply the alcohol vapor into chamber 16. By introducing heated ionized nitrogen gas into chamber 16 as described above, the following effects can be expected. Because of an insulating structure of chamber 16 formed of an anticorrosive material, even if a substantial amount of static electricity (2–10 kV) is generated in chamber 16, the static electricity is electrically canceled out by the ionized nitrogen gas. Therefore, adhesion of particles to the wafer surface as a result the static electricity can be effectively prevented.

When the wafer is completely removed from the heated deionized water, air open/close valve 48 is closed, and air open/close valve 56 is opened to stop supplying heated deionized water to rinsing bath 12. Simultaneously, air open/close valve 68 is opened, and the heated deionized water in rinsing bath 12 is discharged to the drain through flow lines 58 and 60. After the heated deionized water is discharged from rinsing bath 12, air open/close valves 68, 70 are closed. As soon as the heated deionized water begins to be discharged from rinsing bath 12, air open/close valves 76, 78 are opened to operate water ring vacuum pump 82. Chamber 16 is evacuated through vacuum flow lines 72, 74 and 80. By reducing the pressure in chamber 16, alcohol condensing on the wafer surface and replaced with deionized water is evaporated, and the wafers are dried. At the time when the wafers are completely removed from the heated deionized water, and the pressure in chamber 16 begins to be reduced, air open/close valve 88 is closed so that supply of the alcohol vapor in chamber 16 is halted. However, a small amount of alcohol vapor may continuously be supplied to chamber 16 even when chamber 16 is being depressurized. Reduction of the pressure in chamber 16 and supply of the alcohol vapor into chamber 16 may be alternately carried out.

When the wafers are completely dried, vacuum pump 82 is halted. The reduced pressure in chamber 16 is returned to atmospheric pressure. As described above, when supplying the alcohol vapor into chamber 16 is carried out simultaneously with supplying of heated ionized nitrogen gas into chamber 16, only a small amount of heated ionized nitrogen gas is continuously supplied into chamber 16 until the wafers are completely dried under reduced pressure. Heated nitrogen gas (ionization of which is not required) may be supplied into chamber 16 until the reduced pressure in chamber 16 is returned to atmospheric pressure after drying of the wafers is completed. After air open/close valve 98 is closed, and supplying of nitrogen gas into chamber 16 is halted, sealing lid 24 is opened, and the cassette C carrying the wafers which have already been rinsed and dried is taken out from chamber 16 through opening 22.

Figure 3:
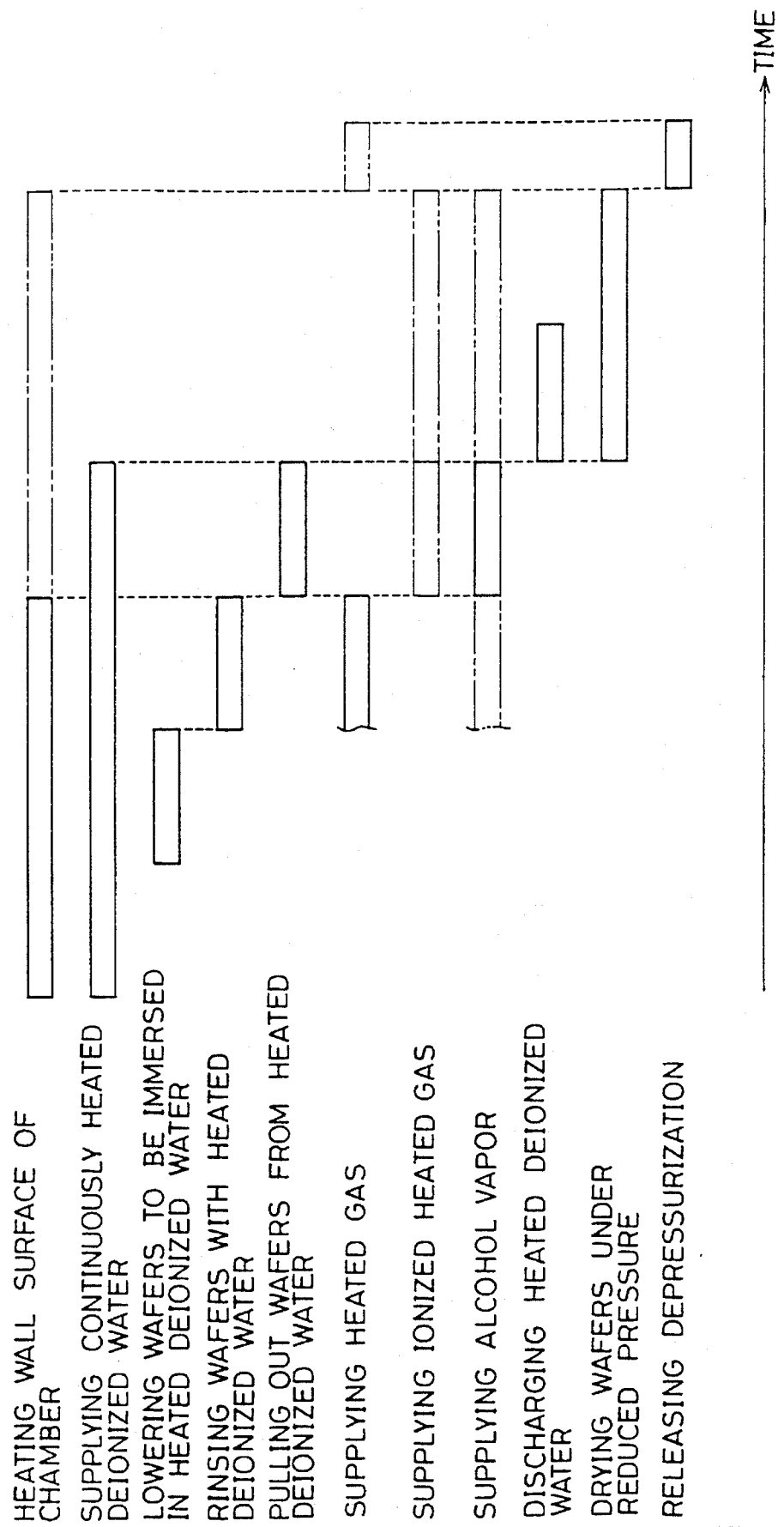
FIG. 3 is a diagram showing one example of a timing chart in a series of steps of rinsing and drying a wafer according to a method of the present invention.

FIG. 3 shows a timing chart of the above-described series of steps of rinsing and drying a wafer.

In the method of rinsing and drying a wafer as described above, after the wafer is immersed in deionized water in the rinsing bath and rinsed, the wafer is elevated and supplying from the deionized water in the rinsing bath. In the step of pulling out the wafer, alcohol vapor is supplied to the surroundings of the wafer. Thereafter, the deionized water in the rinsing bath is discharged from the rinsing bath and the pressure around the wafer is reduced. Alternatively, after a wafer is immersed in deionized water in the rinsing bath 12 and rinsed, the deionized water in the rinsing bath 12 may be discharged therefrom with the wafer still in the rinsing bath 12. In this case, the wafer is exposed rather than being submerged in the deionized wafer, and the alcohol vapor is supplied to the surroundings of the water in the step of discharging the deionized water. Then, the surroundings of the wafer is depressurized.

In the above-described embodiment, nitrogen gas sent from the supply source for nitrogen gas is heated by a heater 90, and alcohol vapor generated in the alcohol vapor generating unit 92 is supplied into the chamber 16 with the heated nitrogen gas. The alcohol vapor may be supplied into the chamber with the nitrogen gas sent from the supply source for nitrogen gas without heating the nitrogen gas. The wafer may be rinsed in the rinsing bath 12 not with heated deionized water but with unheated deionized water. In order to heat the wall surface of the chamber 16, a UV lamp or the like may be used instead of a rubber heater 25 as described above and shown in the drawings. The wall surface of the chamber 16 does not have to be heated, if not necessary.

(2) Second Embodiment

Description will now be given of a specific application (a first application) of the device for rinsing and drying a substrate shown in the first embodiment.

Figure 4:
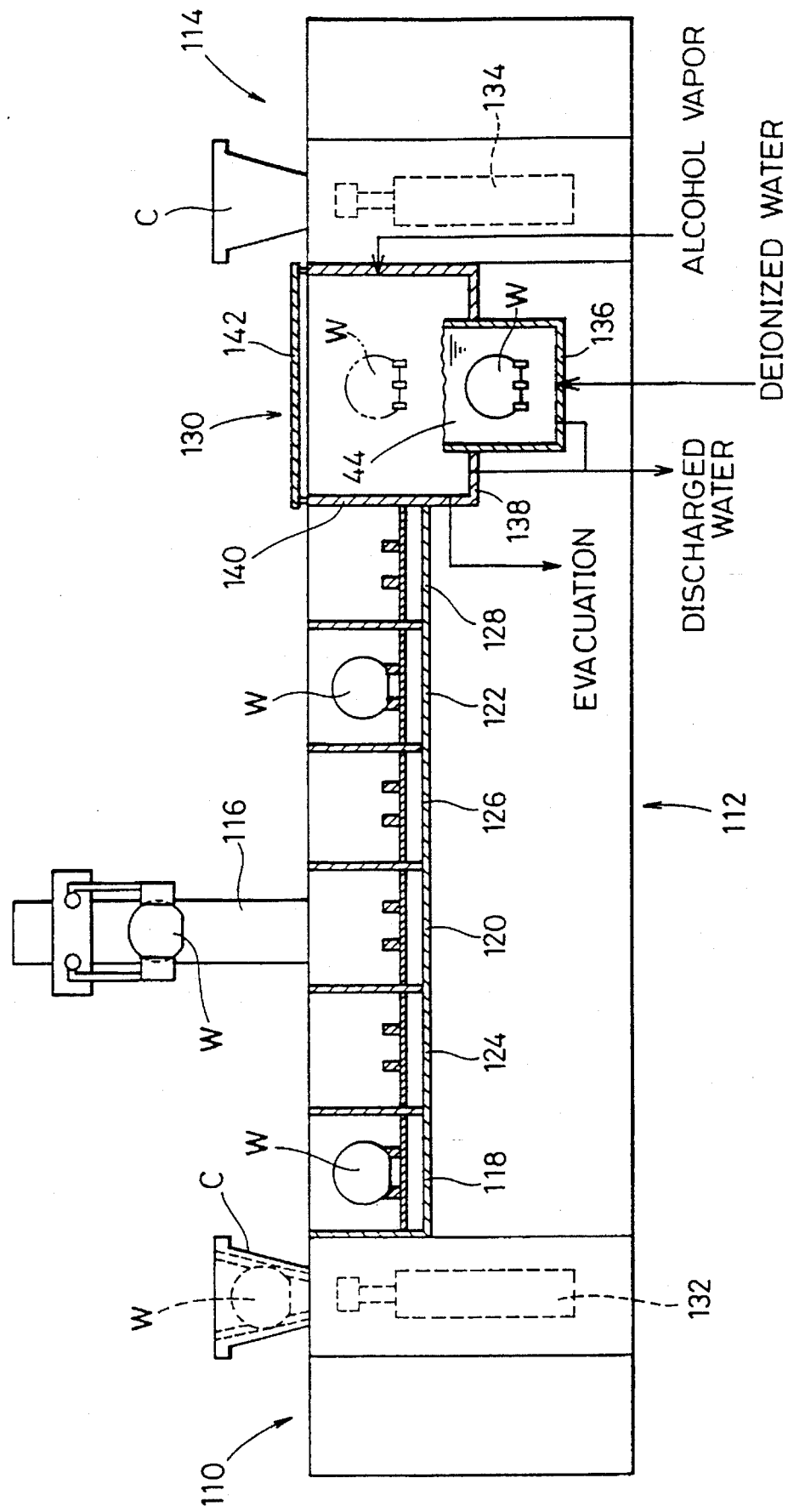
FIG. 4 is a sectionalized schematic of an apparatus serving as a first application of the device for rinsing and drying a substrate according to the present invention.
Figure 5:
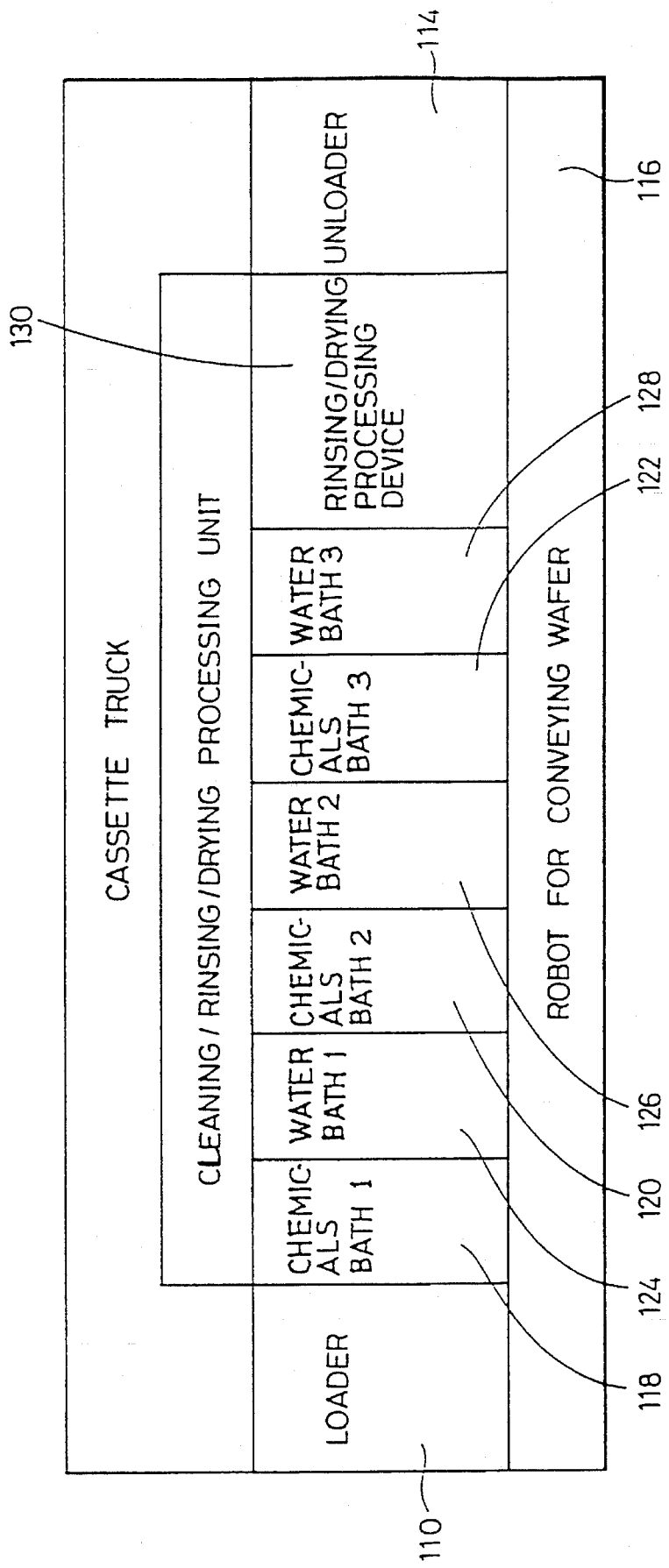
FIG. 5 is a plan view in the form of a layout diagram of the apparatus shown in FIG. 4.

Now FIG. 4 now refer to the front view of the schematic configuration of which shows apparatus that incorporates a device for rinsing and drying a wafer according to the first embodiment. Also refer to the schematic plan layout diagram of FIG. 5 which shows the configuration of such apparatus. The apparatus includes a loader 110, a cleaning/drying processing unit 112, an unloader 114, a robot 116 for conveying a wafer, and a cassette truck (not shown in FIG. 4). Cleaning/drying processing unit 112 includes three baths 118, 120, 122 for cleaning a wafer with chemicals (each hereinafter referred to as a "chemicals bath"), and three baths 124, 126,128 for cleaning a wafer with deionized water (each hereinafter referred to as a "deionized water bath"). Bath 124 is upstream of bath 126 and the latter is upstream of bath 128. Deionized water rinsing baths 124, 126,128 are disposed downstream of the respective chemicals rinsing baths 118, 120, 122 and adjacent thereto. A rinsing/drying processing device 130 is disposed adjacent and downstream of the third deionized water bath 128. The first chemicals bath 118 contains a mixed solution of ammonia water and hydrogen peroxide water, the second chemicals bath 120 contains hydrofluoric acid, and the third chemicals bath 122 contains a mixed solution of hydrochloric acid and hydrogen peroxide water. Deionized water baths 124, 126, 128 contain deionized water. Loader 110 is provided with a wafer device 132 that transfers a plurality of wafers W to be cleaned carried from the cassette C at loader 110 to robot 116. Unloader 114 is provided with a wafer delivery device 134 for delivering the plurality of wafers which have already been processed in cleaning/drying processing unit 112 from robot 116 to an empty cassette C at unloader 114.

In the first application, the device according to the present invention is applied as rinsing/drying processing device 130. In the first application, the device according to the present invention to constitutes the final stage of the wet station. After processing wafer with chemicals, the rinsing/drying is carried out according to the first application.

Rinsing/drying processing device 130 includes, as described in the previous embodiment, a rinsing bath 136, and an overflow receptacle unit 138 that receives liquid that overflows bath at its upper periphery. Device 130 also includes a hermetically sealable chamber 140 having an open/close lid 142 to cover rinsing bath 136 and overflow receptacle unit 138. Rinsing bath 136 has a supply inlet for deionized water provided at its bottom portion. Deionized water 144 is always supplied into rinsing bath 136 through the supply inlet for deionized water from a supply source for deionized water. An overflow edge is provided at the upper portion of rinsing bath 136. Deionized water flowing over the overflow portion of bath 136 always enters overflow receptacle unit 138, so that an upflow of deionized water 144 is formed in rinsing bath 136. Deionized water entering overflow receptacle unit 138 is discharged through a discharge outlet for deionized water provided at the bottom of overflow receptacle unit 138. Chamber 140 is provided with a supply inlet through which vapor of an organic solvent, for example, vapor of isopropyl alcohol, is supplied into chamber 140. This supply inlet for vapor is connected to a supply source for alcohol vapor through a flow line for supplying vapor. Arrangement of a flow line for supplying vapor or the like, not shown, is as described in the previous embodiment.

A series of steps of rinsing and drying a substrate using an apparatus for rinsing and drying a substrate embodying the above-described structure.

The cassette C carrying a plurality of wafers W to be rinsed is conveyed to loader 110 and mounted thereon. The plurality of wafers W are collectively by wafer delivery device 123 from the cassette C at loader 110 to robot 116. Then, the plurality of wafers W are collectively fed into the first chemicals bath 118 by robot 166 and, as seen in FIG. 4, are held in chemicals bath 118 by a wafer holder. Predetermined chemicals are continuously supplied into chemicals bath 118, and chemicals overflowing from chemicals bath 118 are circulated. The wafers W are immersed in the chemicals in chemicals bath 118, whereby the wafers W are subjected to a predetermined cleaning processing. The plurality of wafers W cleaned in chemicals bath 118 are again delivered to wafer conveyor robot 116. The plurality of wafers W are collectively fed into the first deionized water bath 124 by robot 116 where these wafers W are, held by a wafer holder. Deionized water is continuously supplied into deionized water bath 124, and deionized water overflows from the upper portion of deionized water bath 124. The wafers W are placed in an upflow of deionized water in deionized water bath 124, whereby the surface of the wafers W is cleaned. Similarly, the plurality of wafers W are collectively conveyed in sequence by robot 116 to the second chemicals bath 120, the second deionized water bath 116, the third chemicals bath 122, and the third deionized water bath 128, and the wafers are cleaned with chemicals and deionized water, repeatedly. The plurality of wafers W which have been cleaned in the third deionized water bath 128 are collectively conveyed to rinsing/drying processing device 130 by robot 116.

The plurality of wafers W are collectively conveyed into chamber 140 of rinsing/drying processing device 130 where wafers W are received by the wafer holder portion of device 130 which can be elevated and lowered by the wafer elevating and lowering mechanism. With wafers W inside of chamber 140 open/close lid 142 is closed to hermetically seal chamber 140. At this time, deionized water 144 is continuously supplied from the supply source for deionized water into rinsing bath 136 through the bottom supply inlet for deionized water. Deionized water 144 filling rinsing bath 136 flows over the upper overflow portion therefore to enter overflow receptacle unit 138. Deionized water 144 is discharged from overflow receptacle unit 138 through the outlet for discharging deionized water. An upflow of deionized water 144 is formed in rinsing bath 136. When the plurality of wafers W are collectively held by the wafer holder, the wafer elevating and lowering mechanism is operated to lower the wafers W. The wafers W are immersed in deionized water 144 in rinsing bath 136. By being placed in the upflow of deionized water 144 for a predetermined time, the wafers W are finally rinsed. As a result, the surface of the wafers W is completely cleaned and rinsed.

Then, the wafers are dried and conveyed out of the chamber as described in the first embodiment.

In the apparatus of FIG. 4 for rinsing and drying a wafer of according to the first application, since the wafer W is placed in hermetically sealed chamber 140 until the drying processing is completed after the wafer W which was cleaned with chemicals and deionized water is finally rinsed, the wafer W does not come into contact with the atmosphere at all. As a result, both adhesion of particles and adsorption of gas, such as carbonic acid gas and oxygen, to the surface of the wafer W are prevented.

Description will now be given of another application of the device for rinsing and drying a substrate according to the first embodiment. In this second application, the device of the first embodiment can supply a chemicals processing solution in addition to deionized water. After being processed with the processing solution, a wafer is rinsed with deionized water and dried.

Figure 6:
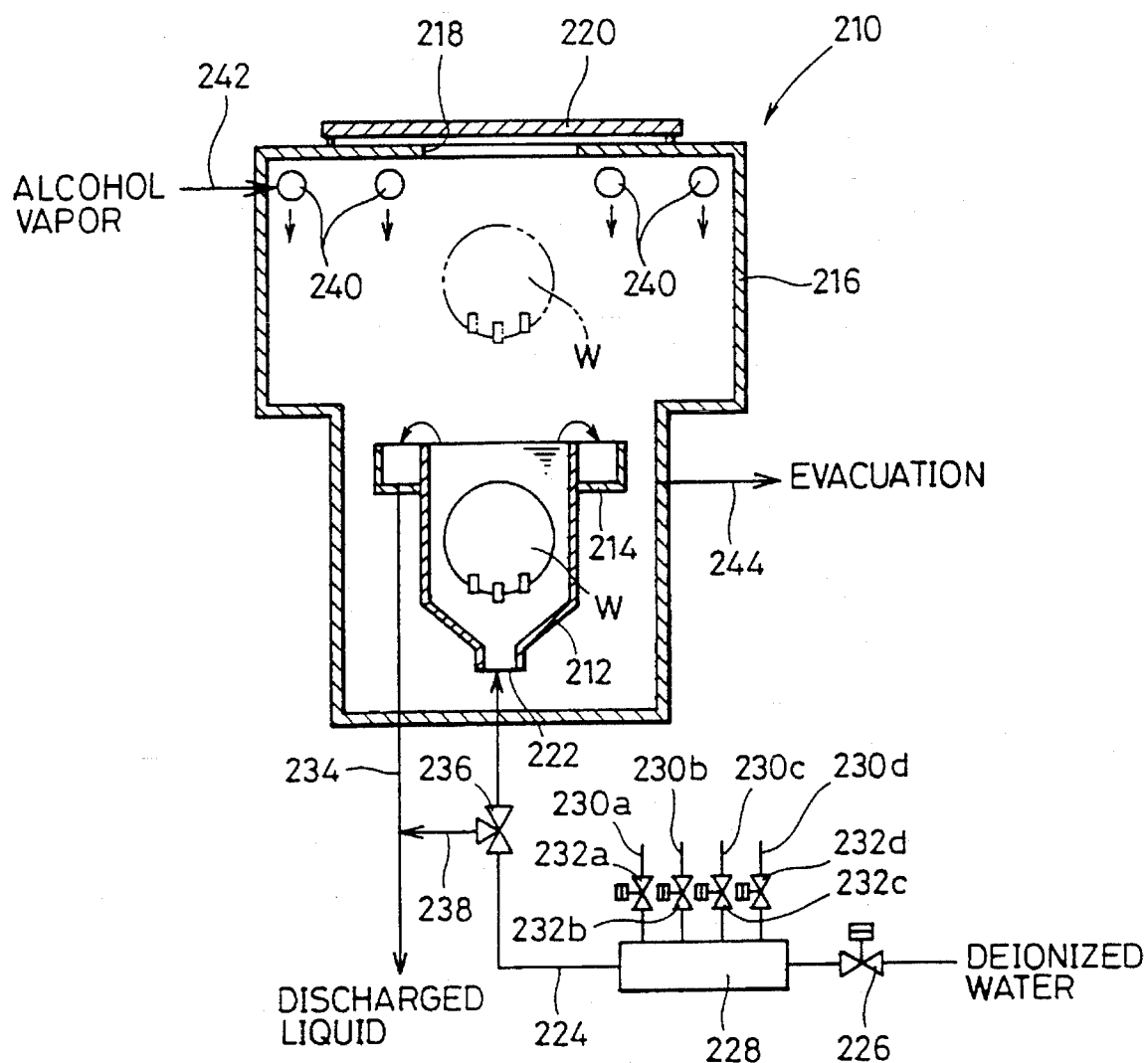
FIG. 6 is a sectionalized diagram showing an apparatus constituting a second application of the device according to the present invention.
Figure 7:
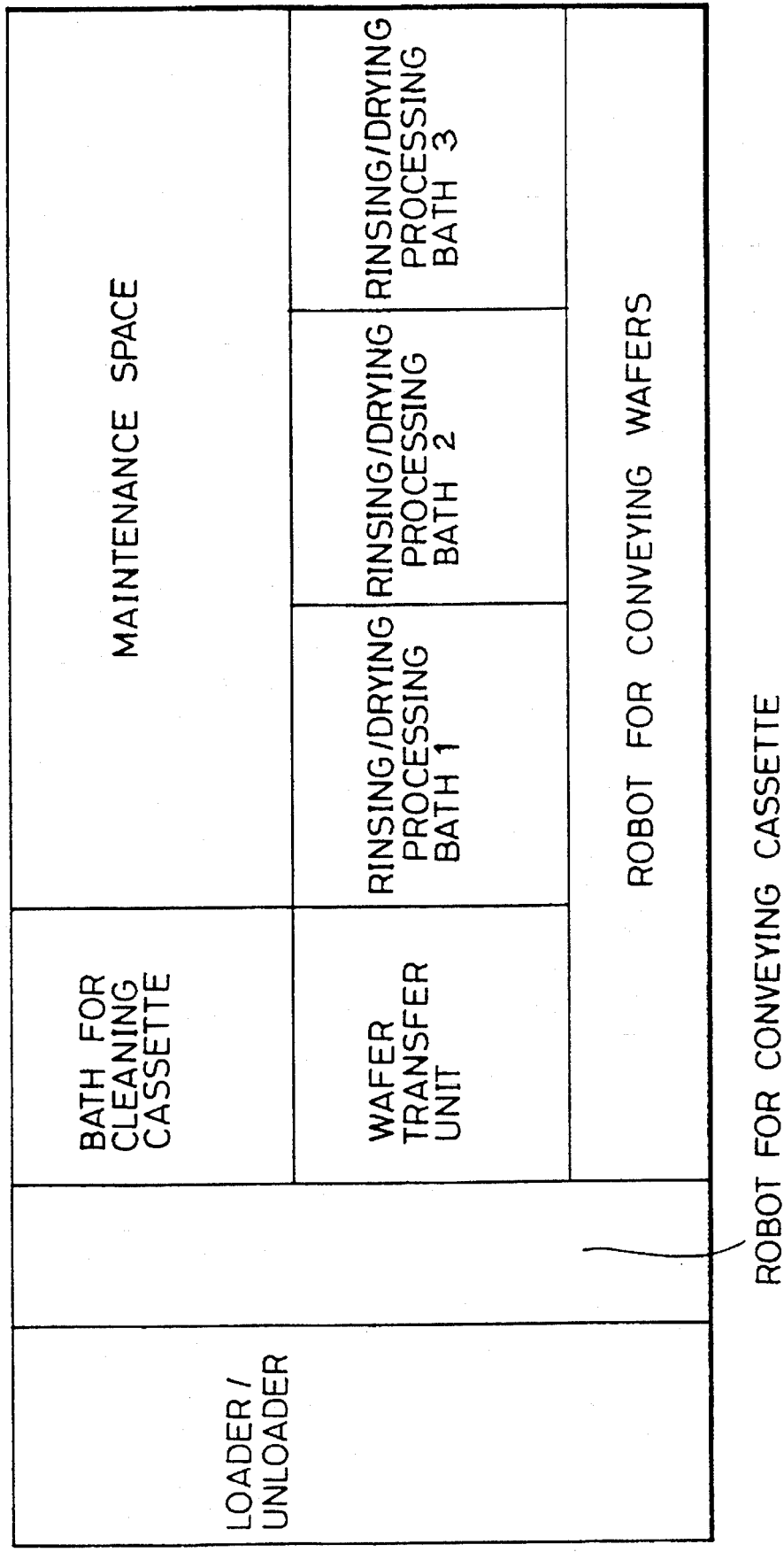
FIG. 7 is a plan view in schematic form of the apparatus shown in FIG. 6.

FIG. 6 is a front sectional view showing one example of a schematic configuration of an apparatus for rinsing and drying a wafer, which is the second application of the device according to the first embodiment. FIG. 7 is a schematic plan layout diagram of the apparatus according to this application which apparatus includes a loader/unloader, three rinsing/drying processing baths, a robot for conveying wafers, a robot for conveying a cassette, a unit for transferring a wafer, a bath for rinsing cleaning a cassette as by rising, a maintenance space, and the like. One of the three rinsing/drying processing baths can be used as an acid rinsing/drying processing bath which carries out acid rinsing (prerinsing) and drying processing.

Description will now be given of an individual cleaning/drying process. Basically, the device used in the process is similar to that of the first embodiment.

As shown in FIG. 6, a rinsing/drying processing device 210 corresponding to the device of the first embodiment includes a rinsing bath 212, and an overflow receptacle unit 214 provided at its upper periphery of rinsing bath 212, all of which are enclosed in an hermetically sealable chamber 216. Chamber 216 is provided at its upper portion with an opening 218 for conveying a wafer W in and out. An open/close lid 220 is provided which can open and hermetically close opening 218. The bottom portion of rinsing bath 212 is provided with a supply inlet 222 for a liquid. Supply inlet 222 is connected to a supply source for deionized water by a flow line 224 for supplying a liquid which flows line 224 is provided with an open/close valve 226. Flow line 224 is also provided with a mixing valve 228 in a passage between open/close valve 226 and supply inlet 222 of rinsing bath 212. Provision of the mixing valve differentiates this application from the first embodiment. To also connected to mixing valve 228, are a plurality of flow lines 230a, 230b, 230c, 230d for supplying chemicals whose passages are connected to supply sources for rinsing chemicals of different kinds, respectively. Flow lines 230a–230d are provided with open/close valves 232a–232d, respectively. By opening one of open/close valves 232a–230d provided at flow lines 230a–230d, and open/close valve 260, 226 provided at flow line 224, any one kind of rinsing chemicals is mixed into deionized water supplied from the supply source for deionized water, and a predetermined rinsing processing solution is prepared. The rinsing processing solution is supplied through flow line 224 and supply inlet 222 into rinsing bath 212. By closing all of open/close valves 232a–232d provided at flow lines 230a–230d, and opening open/close valve 226 provided at flow line 224, deionized water is supplied into rinsing bath 212 from the supply source for deionized water through flow line 224. A discharge flow line 234 is connected to overflow receptacle unit 214. A branch flow line 238 connected to a drain switch valve 236 provided at flow line 224 is communicated with flow line 234. The rinsing processing solution is continuously supplied into rinsing bath 212 through supply inlet 222. By the processing solution flowing over the upper overflow unit of the rinsing bath, an upflow of the processing solution is formed in the rinsing bath. By being placed in the upflow of the processing solution, the wafer W is rinsed.

Since the other configuration of the apparatus of this application is the same as the device of the first embodiment, the description will not be repeated.

Figure 8:
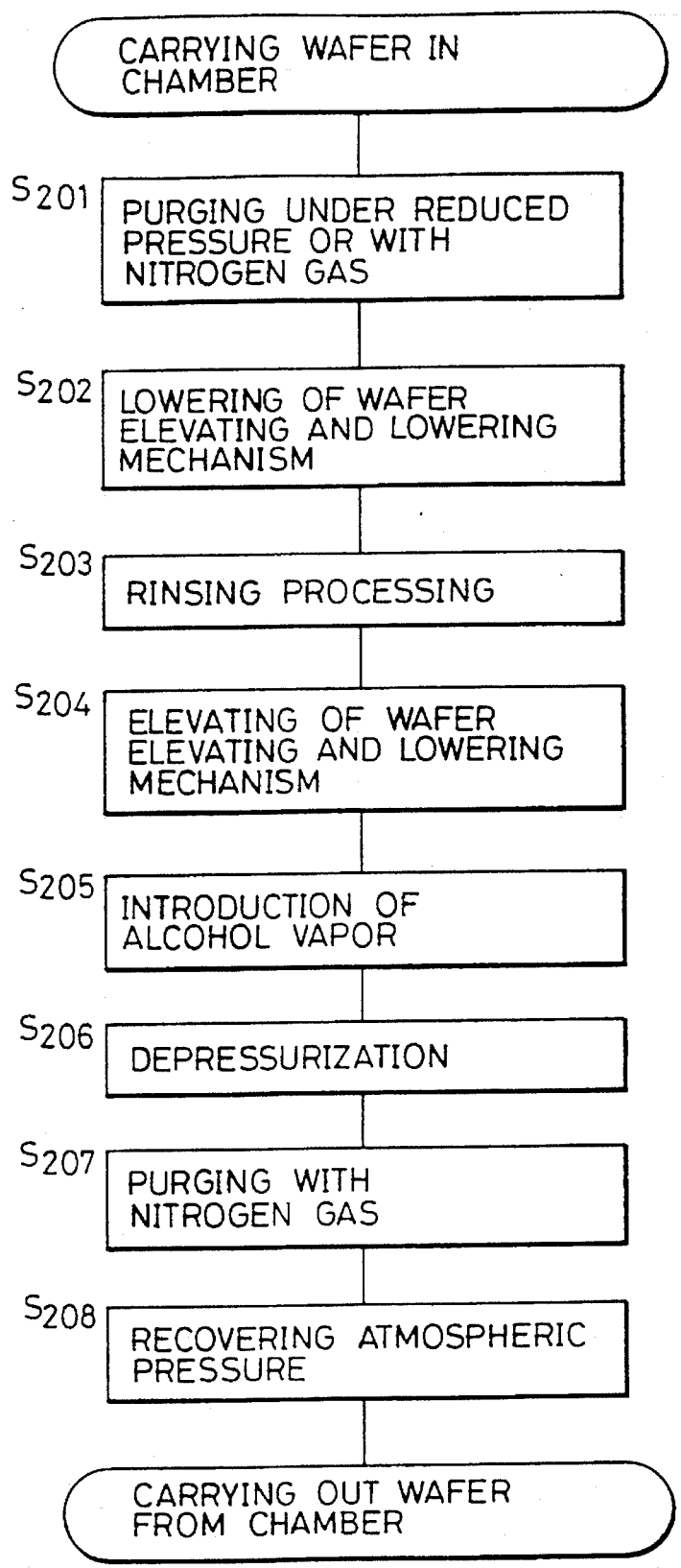
FIG. 8 is a flow chart of rinsing and drying processing according to the second application.

Referring to FIG. 8, description will now be given of a series of steps for rinsing and drying a wafer using the apparatus for rinsing and a drying a wafer according to this application. These steps are basically similar to those of the first embodiment and the first application.

When a cassette carrying a plurality of wafers W to be rinsed is carried to the loader and placed thereon, the cassette is moved by the robot for conveying a cassette to a position at which the wafers are to be transferred. The plurality of wafers are collectively transferred by the wafer transfer unit from the cassette to the robot for conveying wafers. The cassette from which the wafers are taken out is sent to a bath for cleaning a cassette, and cleaned. On the other hand, the wafers transferred to the robot for conveying a wafers are conveyed to the rinsing/drying processing bath. The wafers are rinsed and dried according to a flow chart shown in FIG. 8.

The plurality of wafers W are collectively conveyed into chamber 216 of rinsing/drying processing device 210 by the robot for conveying a wafers. The wafers W are held by the wafer holder which can be elevated and lowered by the wafer elevating and lowering mechanism in chamber 216. When open/close lid 220 is closed and chamber 216 is hermetically sealed, sealed chamber 216 is evacuated by the vacuum pump and purged under reduced pressure (step S201 of FIG. 8). Alternatively, nitrogen gas is introduced into chamber 216 through flow line 242 for supplying vapor, and chamber 216 is purged with gas. At this time, a predetermined rinsing processing solution is continuously supplied into rinsing bath 212 through supply inlet 222 provided at its bottom portion. The processing solution filling rinsing bath 212 flows over the upper overflow portion, and enters overflow receptacle unit 214. The processing solution is discharged from overflow receptacle unit 214 through discharge flow line 234, and an upflow of the processing solution is formed in rinsing bath 212. Then, the wafer elevating and lowering mechanism is operated to lower the plurality of wafers W held by the wafer holder. The wafers W are immersed in the processing solution in rinsing bath 212 (S202). By being placed in the upflow of the processing solution in rinsing bath 212, the wafers W are subjected to a predetermined rinsing processing (S203). By changing the rinsing processing solution supplied into rinsing bath 212 with the wafers W placed in rinsing bath 212, the wafers W are subjected to a plurality of kinds of rinsing processing. Finally, the wafers W are subjected to rinsing processing with deionized water. The wafers W finally rinsed with deionized water are elevated by the wafer elevating and lowering mechanism and thereby removed from deionized water in rinsing bath 212 (S204). As soon as the wafers W begin to be removed from deionized water, alcohol vapor is introduced into chamber 216 from supply inlet 240 for vapor through flow line 242. The alcohol vapor is supplied to the surroundings of the wafers W which are being removed from deionized water (S205). Supplying the alcohol vapor is continued at least until the wafers W are completely removed from deionized water, and at that time supplying deionized water into rinsing bath 212 is stopped. Simultaneously, deionized water in rinsing bath 212 is discharged. As soon as the deionized water begins to be discharged from rinsing bath 212, chamber 216 is evacuated depressurized (S206) by the vacuum pump. As a result, alcohol condensing on the surface of the wafers W and replaced with deionized water is evaporated, and the drying/processing of the wafers W is completed.

When the drying/processing of the wafers W is completed, chamber 216 is purged with nitrogen gas (S207). After operation of the vacuum pump is halted and the reduced pressure in chamber 216 is returned to atmospheric pressure, open/close lid 220 is opened (S208). The wafers W which have been rinsed and dried completely are collectively delivered again to the robot for conveying a wafer from the wafer holder, and removed from chamber 216 by the robot. The plurality of wafers W which have been rinsed and dried completely are transferred from the robot for conveying a wafer to an empty cleaned cassette by the wafer transfer unit. The wafers are carried by the cassette, and to removed from the unloader.

As described above, also in the case of rinsing/drying processing device 210 shown in this application, since the wafers W are disposed in sealed chamber 216 until the wafers are completely dried after final rinsing there, the wafers W does not come into contact with the atmosphere at all. As a result, adhesion of particles and adsorption of gas, such as carbonic acid gas and oxygen, to the surface of the wafers W are prevented.

Figure 9:
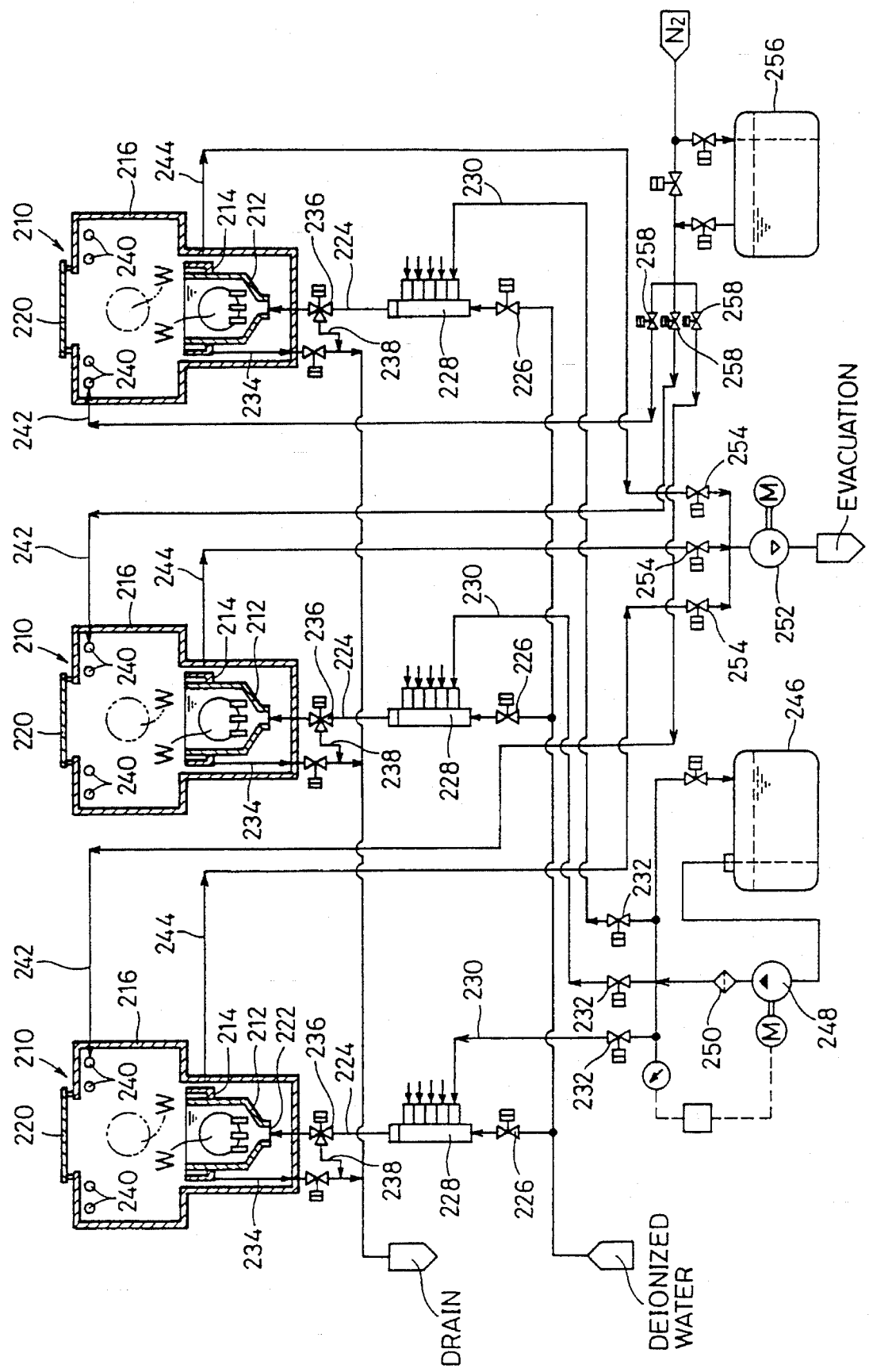
FIG. 9 is a diagram of a piping system where three apparatuses to constituting the second application example of the present invention are utilized.

FIG. 9 shows one example of a piping system when three rinsing/drying processing devices 210 shown in FIG. 6 are provided in an apparatus for rinsing and drying a wafer. Description will now be given of components of FIG. 9 that are not shown in FIG. 6. A device for supplying rinsing chemicals is configured of a storage tank 246 containing rinsing chemicals, a pump 248 for supplying chemicals, and a filter 250. In the figure, only a device for supplying one kind of rinsing chemicals is shown and devices for supplying other chemicals are not shown. An evacuation device for evacuating and depressurizing chamber 216 includes water ring vacuum pump 252, and an evacuation open/close valve 254 provided at evacuation flow line 244. An alcohol vapor generating bath 256 contains an organic solvent, for example, isopropyl alcohol. A device for supplying vapor is configured of alcohol vapor generating bath 256 and open/close valve 258 for supplying vapor. As shown in the diagram of piping system of FIG. 9, it is not necessary to install the device for supplying rinsing chemicals, the evacuation device, and the device for supplying vapor for every rinsing/drying processing device 210. These devices can be shared among three rinsing/drying processing devices 210.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A device for processing a substrate, comprising:
    a hermetically sealable process chamber;
    a rinsing bath for rinsing a substrate that is inside said process chamber and said rinsing bath having an upper opening portion;
    substrate holding means for holding the substrate while same is in said rinsing bath;
    means for supplying a rinsing solution in said rinsing bath so that the rinsing solution overflows from the upper opening portion of said rinsing bath;
    means for removing said substrate from said rinsing solution after rinsing;
    means for reducing pressure in said process chamber; and
    means for supplying vapor of an organic solvent to surroundings of the substrate that has been removed from said rinsing bath;
    said vapor of said organic solvent being condensed on said substrate and then being evaporated while pressure within said process chamber is reduced, with exposure of said substrate to said vapor of said organic solvent serving to lower surface tension of said rinsing solution while exposing said substrate.

2. The device as recited in claim 1, further comprising means for thermally insulating said process chamber.

3. The device as recited in claim 2, wherein
    said vapor of the organic solvent includes a mixture of the organic solvent and inactive gas.

4. The device as recited in claim 2, wherein
    said vapor of the organic solvent includes ionized vapor of said organic solvent.

5. The device as recited in claim 1, wherein
    said rinsing solution is deionized water,
    said device constitutes a part of an apparatus for cleaning, rinsing and drying said substrate, and
    said apparatus includes a bath for cleaning a substrate with chemicals and a bath for cleaning a substrate with deionized water, and a bath for rinsing a substrate, and said device includes said bath for rinsing a substrate.

6. The device as recited in claim 5, wherein
    said device further includes means for thermally insulating said process chamber.

7. The device as recited in claim 6, wherein
    said vapor of the organic solvent includes a mixture of the organic solvent and inactive gas.

8. A device as defined in claim 1 also comprising:
    first means for supporting a substrate to be processed;
    another chamber different from said process chamber;
    means using a chemical for cleaning a substrate while said substrate is in said another chamber;
    said rinsing solution comprising deionized water that washes any of said chemical that may become attached to said substrate during cleaning thereof;
    substrate holding means for holding the substrate while the same is in said rinsing bath;
    drying means for drying said substrate after said substrate has been rinsed and while said substrate is in said process chamber;
    second means for receiving the substrate dried by said drying means; and
    third means for transferring the substrate between said first means, said another chamber, said process second chamber, and said second means.

9. A method of rinsing and drying a substrate, comprising steps of:
    supplying a rinsing solution into a rinsing bath continuously, and making the rinsing solution overflow from an upper portion of the rinsing bath, to form an upflow of the rinsing solution in the rinsing bath;
    placing the substrate in said upflow of the rinsing solution to rinse said substrate;
    removing said substrate from said rinsing solution while supplying vapor of an organic solvent to surroundings of said substrate serving to lower surface tension of said rinsing solution; and
    drying said substrate with the surroundings of said substrate reduced in pressure;

said vapor of said organic solvent being condensed on said substrate and then being evaporated while pressure within said process chamber is reduced.

10. The method as recited in claim 9, wherein the organic solvent is ionized.

11. A device for cleaning, rinsing and drying a substrate, comprising:

a hermetically sealable process chamber;

a process bath located in said process chamber and having an upper opening portion;

substrate holding means for holding the substrate while the same is in said process bath;

selective supply means for selectively supplying either of a rinsing chemical and a deionized water to said process bath so that either of said rinsing chemical and said deionized water that is selectively supplied overflows from the upper opening portion of said process bath;

removing means for removing said substrate from said process bath after rinsing in said deionized water;

means for reducing pressure in said process chamber;

means for supplying vapor of an organic solvent to surroundings of the substrate that has been removed from said process bath, with exposure of said substrate to said vapor of said organic solvent serving to lower surface tension of said rinsing chemical while exposing said substrate; and means for controlling said selective supply means in response to either one of cleaning by using said rinsing chemical, rinsing by using said deionized water and drying by exposure to said vapor of said organic solvent.

\* \* \* \* \*